United States Patent
Li

(10) Patent No.: US 12,087,734 B2
(45) Date of Patent: Sep. 10, 2024

(54) METHOD FOR FORMING CHIP PACKAGES AND A CHIP PACKAGE HAVING A CHIPSET COMPRISING A FIRST CHIP AND A SECOND CHIP

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 17/542,415

(22) Filed: Dec. 4, 2021

(65) Prior Publication Data
US 2022/0181295 A1  Jun. 9, 2022

(30) Foreign Application Priority Data

Dec. 4, 2020  (CN) .......................... 202011408981.5
Dec. 4, 2020  (CN) .......................... 202011411137.8
Dec. 4, 2020  (CN) .......................... 202011412884.3

(51) Int. Cl.
*H01L 25/065* (2023.01)
*H01L 21/48* (2006.01)
(Continued)

(52) U.S. Cl.
CPC ........ *H01L 25/0655* (2013.01); *H01L 21/486* (2013.01); *H01L 21/561* (2013.01);
(Continued)

(58) Field of Classification Search
CPC ......... H01L 24/16; H01L 24/48; H01L 24/73; H01L 24/81; H01L 24/82; H01L 24/95;
(Continued)

(56) References Cited

U.S. PATENT DOCUMENTS 10,593,641 B2 * 3/2020 Qiu .................... H01L 24/19
10,651,126 B2 * 5/2020 Hsiung ............... H01L 23/5386
(Continued)

FOREIGN PATENT DOCUMENTS

CN  104218022  12/2014
CN  104617072 A  5/2015
(Continued)

OTHER PUBLICATIONS

Weiping Li, U.S. Appl. No. 17/542,416, Non-Final Office Action issued Sep. 8, 2023.
(Continued)

*Primary Examiner* — Khiem D Nguyen
(74) *Attorney, Agent, or Firm* — USCH Law, PC

(57) ABSTRACT

The present application provides a method for forming a chip package and a chip package. The method comprises mounting at least one chipset including at least first and second chips on a carrier with front surface of the chips face away from the carrier; attaching an interconnection device to the front surfaces of the first and second chips to enable electrically connections between the chips; forming a molded encapsulation layer whereby the first chip, the second chip and the interconnection device are embedded or partially embedded in the molded encapsulation layer; thinning one side of the molded encapsulation layer away from the carrier to expose first bumps on the first and second chips; forming second bumps on a surface of one side of the molded encapsulation layer where the first bumps are exposed; and removing the carrier. Thus, a flexible, efficient and low-cost packaging scheme is provided for multi-chip connection.

17 Claims, 6 Drawing Sheets

(51) Int. Cl.
*H01L 21/56* (2006.01)
*H01L 23/00* (2006.01)
*H01L 23/31* (2006.01)
*H01L 23/48* (2006.01)
*H01L 23/498* (2006.01)

(52) U.S. Cl.
CPC ........ *H01L 21/568* (2013.01); *H01L 23/3107* (2013.01); *H01L 23/481* (2013.01); *H01L 23/49827* (2013.01); *H01L 23/4985* (2013.01); *H01L 24/16* (2013.01); *H01L 24/48* (2013.01); *H01L 24/73* (2013.01); *H01L 24/81* (2013.01); *H01L 24/82* (2013.01); *H01L 24/95* (2013.01); *H01L 24/96* (2013.01); *H01L 2224/16157* (2013.01); *H01L 2224/16227* (2013.01); *H01L 2224/81143* (2013.01); *H01L 2224/81203* (2013.01); *H01L 2224/8212* (2013.01); *H01L 2224/82203* (2013.01); *H01L 2224/95001* (2013.01); *H01L 2924/10253* (2013.01); *H01L 2924/10272* (2013.01); *H01L 2924/10329* (2013.01); *H01L 2924/1033* (2013.01); *H01L 2924/15311* (2013.01)

(58) Field of Classification Search
CPC ..... H01L 24/96; H01L 25/50; H01L 25/0655; H01L 23/5385; H01L 23/49827; H01L 23/3107; H01L 21/568; H01L 21/4985; H01L 2924/10253; H01L 2924/1033; H01L 2224/16157; H01L 2224/16227; H01L 21/486; H01L 23/3128
USPC ........................................................ 257/737
See application file for complete search history.

(56) References Cited

U.S. PATENT DOCUMENTS

| | | | |
|---|---|---|---|
| 10,796,999 B2* | 10/2020 | Koh | H01L 23/5381 |
| 10,903,166 B2* | 1/2021 | Ganesan | H01L 24/95 |
| 11,075,166 B2* | 7/2021 | Li | H01L 23/5385 |
| 2006/0284292 A1* | 12/2006 | Cheng | H01L 21/561 |
| | | | 257/678 |
| 2009/0020323 A1 | 1/2009 | Chen et al. | |
| 2011/0068459 A1 | 3/2011 | Pagaila et al. | |
| 2011/0084386 A1 | 4/2011 | Pendse | |
| 2012/0061856 A1 | 3/2012 | Vora | |
| 2015/0163904 A1* | 6/2015 | Karhade | H01L 23/5387 |
| | | | 361/679.02 |
| 2015/0228551 A1 | 8/2015 | Oi et al. | |
| 2017/0287870 A1* | 10/2017 | Fang | H01L 23/552 |
| 2019/0006281 A1 | 1/2019 | Georg et al. | |
| 2019/0157205 A1* | 5/2019 | Deshpande | H01L 23/522 |
| 2020/0035603 A1 | 1/2020 | Rubin | |
| 2020/0051949 A1* | 2/2020 | Tsai | H01L 24/19 |
| 2020/0075546 A1 | 3/2020 | Shih et al. | |
| 2020/0176384 A1* | 6/2020 | Wu | H01L 25/0655 |
| 2020/0176410 A1* | 6/2020 | Qiu | H01L 21/6835 |
| 2020/0243449 A1 | 7/2020 | Chiang et al. | |
| 2020/0303364 A1* | 9/2020 | Chen | H01L 24/33 |
| 2020/0312767 A1 | 10/2020 | Pietambaram et al. | |
| 2020/0335443 A1 | 10/2020 | Zhou et al. | |

FOREIGN PATENT DOCUMENTS

| | | |
|---|---|---|
| CN | 107017238 A | 8/2017 |
| CN | 110197793 A | 9/2019 |
| CN | 110707075 A | 1/2020 |
| EP | 3751607 | 3/2020 |
| TW | 200943440 A | 10/2009 |
| TW | 201535667 A | 9/2015 |
| TW | 202006842 A | 2/2020 |
| TW | 202015194 A | 4/2020 |
| TW | 202029449 A | 8/2020 |
| TW | I715257 B | 1/2021 |
| TW | 202135243 A | 9/2021 |

OTHER PUBLICATIONS

Weiping Li, U.S. Appl. No. 17/542,416, Response to Non-Final Office Action dated Sep. 8, 2023, filed Dec. 8, 2023.
Shanghai Yibu Semiconductor Co., Ltd., CN the First Office Action, CN 202011411137.8, Jun. 22, 2021, 10 pgs.
Shanghai Yibu Semiconductor Co., Ltd., CN the Second Office Action, CN 202011411137.8, Sep. 14, 2021, 6 pgs.
Shanghai Yibu Semiconductor Co., Ltd., TW the First Office Action and Search Report, TW 110145135, Nov. 28, 2022, 9 pgs.
Shanghai Yibu Semiconductor Co., Ltd., TW the Second Office Action, TW 110145135, Jul. 31, 2023, 8 pgs.
Shanghai Yibu Semiconductor Co., Ltd., CN the First Office Action, CN 202011408981.5, Jun. 18, 2021, 10 pgs.
Shanghai Yibu Semiconductor Co., Ltd., CN the Second Office Action, CN 202011408981.5, Aug. 25, 2021, 9 pgs.
Shanghai Yibu Semiconductor Co., Ltd., CN the Third Office Action, CN 202011408981.5, Nov. 9, 2021, 13 pgs.
Shanghai Yibu Semiconductor Co., Ltd., TW the Second Office Action, TW 110145134, Dec. 21, 2022, 16 pgs.
Shanghai Yibu Semiconductor Co., Ltd., English Translation of KR First Office Action, KR10-2021-0171478, Dec. 3, 2021, 6 pgs.
Shanghai Yibu Semiconductor Co., Ltd., CN the First Office Action, CN 202011412884.3, Jun. 17, 2021, 14 pgs.
Shanghai Yibu Semiconductor Co., Ltd., TW the First Office Action, TW 110145240, Jun. 1, 2022, 3 pgs.
Shanghai Yibu Semiconductor Co., Ltd., English Translation of KR First Office Action, KR 10-2021-0171482, Dec. 3, 2021, 5 pgs.

* cited by examiner

100

101 — Providing a carrier and at least one chipset, wherein each chipset comprises at least a first chip and a second chip, and mounting the first chip and the second chip in each chipset on the surface of the carrier with the front surfaces facing upwards (i.e., away from the carrier), wherein the front surfaces of the first chip and the second chip are provided with first bumps

102 — Attaching an interconnect device to the front surfaces of the first and second chips to enable the first chip in each chipset to be electrically connected to the second chip through the interconnect device

103 — Forming a molded encapsulation layer around the first chip and the second chip, wherein the first chip, the second chip and the interconnection device are embedded in the molded package layer

104 — Thinning one side of the molded package layer away from the carrier to expose the first bumps of the first chip and the second chip

105 — Forming second bumps on a surface of one side of the molded package layer

106 — Removing the carrier

FIG. 1

METHOD FOR FORMING CHIP PACKAGES AND A CHIP PACKAGE HAVING A CHIPSET COMPRISING A FIRST CHIP AND A SECOND CHIP

CROSS REFERENCE TO RELATED APPLICATIONS

This application claims the benefit of priority under the Paris Convention to Chinese Patent Application No. CN202011411137.8, filed Dec. 4, 2020, entitled "Method for Forming Chip Packages and a Chip Package," Chinese Patent Application No. CN202011408981.5, filed Dec. 4, 2020, entitled "Chip Interconnecting Method, Interconnect Device and Method for Forming Chip Packages," and Chinese Patent Application No. CN202011412884.3, filed Dec. 4, 2020, entitled "Method for Forming Chip Packages and a Chip Package," each of which is incorporated by reference herein in its entirety. This application is related to co-pending U.S. patent application Ser. No. 17/542,417, entitled "Chip Interconnecting Method, Interconnect Device and Method for Forming Chip Packages," filed on even date herewith, and U.S. patent application Ser. No. 17/542,416, entitled "Method for Forming Chip Packages and a Chip Package," filed on even date herewith, each of which is incorporated by reference herein in its entirety.

FIELD

The present application is related to the field of semiconductors, and particularly to a method for forming chip packages and a chip package.

BACKGROUND

This section is intended to provide a background or context to the invention recited in the claims. The description herein is not admitted to be prior art by inclusion in this section.

With the advent of the artificial intelligence era, the trend of semiconductor integrated circuits is toward more functions and faster computation speeds. Simply following the trend by using system-on-chip (SOC) integration on large chips will undoubtedly make circuit design more difficult and more expensive to manufacture. The more practical solution is to use heterogeneous integration technology of multiple chiplets to accomplish functional integration. Based on this, an important task for high-end packaging at present is to develop a high-efficiency and high-density multi-chip interconnection technology, and to replace SOC integration of a large chip using direct connection between bare chips to form a physical layer functional block, thereby realizing low cost and high degree of freedom with the same functionality.

In existing multi-chip interconnection technologies, such as embedded multi-chip interconnection bridging (EMIB), a silicon bridge is embedded in a substrate to realize chip interconnection, so that the interconnection density and the interconnection efficiency can be increased. However, conventional EMIB requires complicated packaging processes and is thus expensive to implement.

SUMMARY

In view of the above problems in existing technologies, a method of forming chip packages and a chip package are provided, with which the above problems can be solved.

In a first aspect, a method of forming a chip package is provided. According to some embodiments, the method comprises providing a carrier and at least one chipset, wherein each chipset comprises at least a first chip and a second chip. The front surfaces of the first chip and the second chip are provided with first bumps. The method further comprises: mounting each chipset on a surface of the carrier such that a front surface of each chip in the chipset faces upwards (i.e., away from the carrier); attaching interconnection devices to the front surfaces of the first and second chips so that the first chip in each chipset is electrically connected to the second chip through the interconnection devices; forming a molded encapsulation layer around the first chip and the second chip, whereby the first chip, the second chip and the interconnection device are embedded or partially embedded in the molded encapsulation layer; thinning one side of the molded encapsulation layer facing away from the carrier to expose some of the first bumps of the first chip and the second chip (e.g., the first bumps not covered by or bonded to an interconnect device); forming second bumps on a surface of one side of the molded encapsulation layer where the first bumps are exposed; and, removing the carrier.

In some embodiments, the at least one chipset includes multiple chipsets, and the method further comprises, after the carrier is removed, dicing the molded encapsulation layer to obtain a plurality of unit packages, wherein each unit package includes a chipset.

In some embodiments, a first region on a first side of the interconnect device is formed with a plurality of first bond pads for respectively bonding to corresponding bumps on the first chip, a second region of the first side of the interconnect device is formed with a plurality of second bond pads for respectively bonding to corresponding bumps on the second chip, and a fan-out circuit is formed between the plurality of first bond pads and the plurality of second bond pads of the interconnect device.

In some embodiments, the interconnect devices are formed as passive devices or active devices.

In some embodiments, the interconnect device includes vertical interconnect vias.

In some embodiments, attaching the interconnect device to the front surfaces of the first and second chips further comprises bonding an interconnection device to the front surfaces of the first chip and the second chip by thermal compression, wherein the interconnection device includes a flexible circuit.

In some embodiments, the method further comprises forming a redistribution (or rewiring) layer on the surface of one side of the molded encapsulation layer where the first bumps are exposed, and forming a plurality of second bumps on the redistribution (or rewiring) layer.

In some embodiments, forming second bumps on a surface of the molded encapsulation layer on a side where the first bumps are exposed includes forming a solder covering (solder clamping) layer on the surface of the side of the molded encapsulation layer, where the first bumps are exposed.

In some embodiments, the front surface of the first chip has a plurality of high-density bumps, and the front surface of the second chip has a plurality of low-density bumps. In some embodiments, a contact surface of each bump among the high-density bumps is smaller than a contact surface of any bump among the low-density bumps. Correspondingly, in some embodiments, the first bond pads of the interconnection device are of a higher density than the second bond pads, and each of the first bond pads on the interconnection device can be smaller in size than any of the second bond pads. The method further comprises aligning and bonding the first bond pads of the interconnection device to the high-density bumps of the first chip, whereby the second bond pads of the interconnection device are self-aligned and bonded to the low-density bumps of the second chip with reference to the high-density bumps.

In some embodiments, the first chip is a processor chip and the second chip is a memory chip.

In a second aspect, a chip package in accordance with some embodiments comprises a first chip and a second chip; and an interconnection device assembled on front surfaces of the first chip and the second chip, whereby the first chip is electrically connected to the second chip through the interconnection device. In some embodiments, the front surfaces of the first chip and the second chip are provided with a plurality of first bumps. The chip package further comprises a the molded encapsulation layer around the first chip and the second chip. In some embodiments, the first chip, the second chip and the interconnection device are embedded or partially embedded in the molded encapsulation layer, and the first bumps of the first chip and the second chip are exposed on a front surface of the molded encapsulation layer. In some embodiments, the chip package further comprises a plurality of second bumps formed on the front surface of the molded encapsulation layer.

In some embodiments, a first region of the first side of the interconnect device is formed with a plurality of first bond pads for respectively bonding to corresponding bumps on the first chip, a second region of the first side of the interconnect device is formed with a plurality of second bond pads for respectively bonding to corresponding bumps on the second chip, and a fan-out circuit is formed between the plurality of first bond pads and the plurality of second bond pads of the interconnect device.

In some embodiments, the interconnect devices are formed as passive devices or active devices.

In some embodiments, the interconnect device includes vertical interconnect vias.

In some embodiments, the interconnect device includes a flexible circuit thermocompressively bonded to the front surfaces of the first and second chips.

In some embodiments, the chip package further comprises a redistribution (or rewiring) layer formed on the front surface of the molded encapsulation layer where the first bumps are exposed, and the plurality of second bumps are formed on the redistribution (or rewiring) layer.

In some embodiments, the plurality of second bumps are formed as a solder covering (solder clamping) layer formed on the surface of a side of the molded encapsulation layer, where the first bumps are exposed.

In some embodiments, the front surface of the first chip has a plurality of high-density bumps, and the front surface of the second chip has a plurality of low-density bumps. In some embodiments, a contact surface of each high-density first bump is smaller than a contact surface of any of the low-density bumps, and wherein in the chip package, the first bond pads of the interconnection device are aligned and bonded to the high-density bumps of the first chip, so that the second bond pads of the interconnection device are self-aligned and bonded to the low-density bumps of the second chip with the high-density bumps as a reference.

In some embodiments, the first chip is a logic chip and the second chip is a memory chip.

Some embodiments of the application achieve the same or similar effects as the EMIB technology with lower cost and simpler manufacturing processes by adopting novel package structure designs and unique process flows. The novel package structure designs and unique process flows according to some embodiments do not require embedding interconnect devices in a substrate, thus reducing the complexity and cycle time of design and fabrication. Further, the associated cost of the substrate is eliminated, thereby providing a flexible and low-cost solution for multi-chip attachment.

The above summary is an overview of the technical solutions of some embodiments, which are described in more detail below with reference to drawings in order to make the aforementioned and other objects, features and advantages comprehensible.

BRIEF DESCRIPTION OF THE DRAWINGS

The advantages and benefits described herein, as well as other advantages and benefits, will be apparent to those of ordinary skill in the art upon reading the following detailed description of some embodiments. The drawings are only for purposes of illustrating exemplary embodiments and are not to be construed as limiting the invention recited in the claims. Also, like reference numerals are used to refer to like elements throughout. In the drawings:

FIG. 1 is a schematic flow chart of a method of forming a chip package according to some embodiments;

In the drawings, the same or corresponding reference numerals indicate the same or corresponding parts.

DETAILED DESCRIPTION OF THE EMBODIMENTS

Figure 2A:
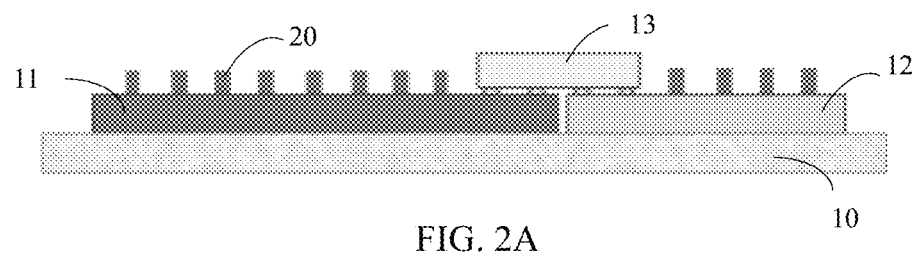
FIGS. 2A to 2E are schematic cross-sectional views illustrating a process of forming a chip package at various stages according to some embodiments.

Certain embodiments of the present disclosure will be described in more detail below with reference to the accompanying drawings. While exemplary embodiments of the present disclosure are shown in the drawings, it should be understood that the present disclosure may be embodied in various forms and should not be limited to the embodiments set forth herein.

The following disclosure provides various embodiments, or examples, for implementing different features of the embodiments. Specific examples of components and arrangements are described below to simplify the present disclosure. These are, of course, merely examples and are not intended to limit the invention. For example, in the following description, attaching interconnection devices (13, 14, 15) to the front surfaces of the first chip 11 and the second chip 12 may include some embodiments in which the first chip 11, the second chip 12 and the interconnection devices (13, 14, 15) are attached in direct contact, and may also include some embodiments in which additional parts may be disposed between the first chip 11, the second chip 12 and the interconnection devices (13, 14, 15) so that the first chip 11, the second chip 12 and the interconnection devices (13, 14, 15) may not be in direct contact. Further, the present application may repeat reference numerals and/or characters in the various embodiments. This repetition is for the purpose of simplicity and clarity and does not in itself dictate a relationship between the various embodiments and/or configurations discussed.

It will be understood that terms such as "including" or "having," or the like, are intended to indicate the presence of the disclosed features, integers, steps, acts, components, parts, or combinations thereof, and are not intended to preclude the presence or addition of one or more other features, integers, steps, acts, components, parts, or combinations thereof.

Also, spatially relative terms, such as "below . . . ," "under . . . ," "down," "above . . . ," "up," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

It should be noted that certain embodiments and/or certain features of the embodiments may be combined with each other without conflict.

FIG. 1 is a flow chart illustrating a method 100 of forming a chip package according to some embodiments. As shown in FIG. 1, the method 100 may include steps 101-106, which are described in further details below.

FIG. 2A-2E illustrate cross-sectional views illustrating various stages in a process of forming a chip package, according to some embodiments.

Referring to FIG. 2A, step 101 is performed, in which carrier 10, first chip 11 and second chip 12 are provided, and first chip 11 and second chip 12 are mounted on the surface of carrier 10 with their front surfaces facing upwards (i.e., away from the carrier). First bumps 20, which may also be referred to as chip pins, are formed on the front surfaces of the first chip 11 and the second chip 12, i.e., the surface of the chip having the chip pins is referred to as a front surface, and the surface opposite to the front surface is referred to as a back surface. For example, in some embodiments, the first bumps 20 may be formed as solder bumps made of a conductive material including Cu, Ag, Au, etc., or alloys thereof, as well as other materials. For example, in some embodiments, two or more chips may be coupled to carrier 10 using automated machinery such as a packaging machine or manually. In some embodiments, an adhesive film (not shown) or a die attach film (not shown) may be used to couple the back sides of the first and second chips 11, 12 to either side of the carrier 10 such that the front sides of the first and second chips 11, 12 are shown outward away from the carrier 10, which may also be referred to as front-up (face-up) in a semiconductor package. In some embodiments, multiple chips including the same or different functions may be packaged together.

Next, step 102 is executed, in which the interconnection device 13 is attached to the front surfaces of the first chip 11 and the second chip 12 so that the first chip 11 is electrically connected to the second chip 12 through the interconnection device 13. For example, in some embodiments, one of the regions of the interconnect device may be bonded to an edge region of the front surface of the first chip 11 and another region of the interconnect device may be bonded to an edge region of the front surface of the second chip 12. For example, in some embodiments, interconnect device 13 includes a passive device. In other embodiments, interconnect device 13 may also be formed to include an active device.

Figure 2B:
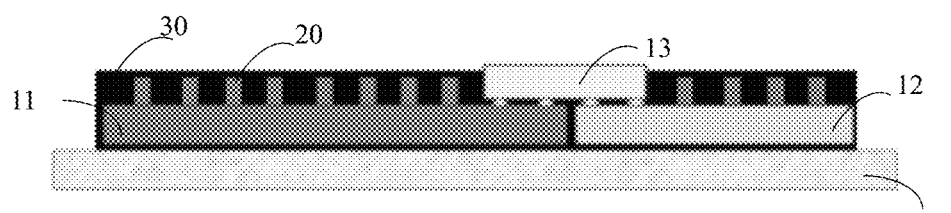

Referring to FIG. 2B, step 103 is performed, in which a molded encapsulation layer 30 is formed around the first chip 11 and the second chip 12. In some embodiments, the first chip 11 and the second chip 12 and the interconnection device 13 are embedded or partially embedded in the molded encapsulation layer 30. For example, in some embodiments, the material of the molded encapsulation layer 30 may include an epoxy, an organic polymer, or a polymer with or without a silicon-based or glass filler. In some embodiments, the material of the molded encapsulation layer 30 may include a liquid molding compound that is a gel-type liquid. The molded encapsulation layer 30 may also include other insulating and/or wrapping or other materials.

Figure 2C:
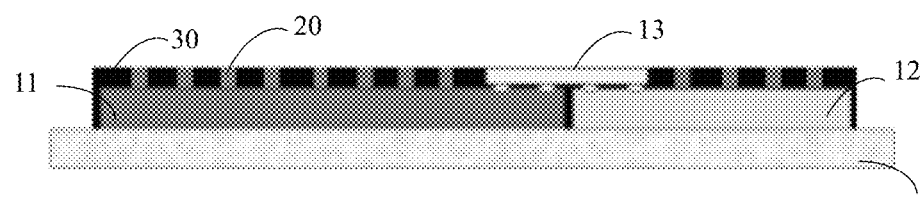

Referring to FIG. 2C, step 104 is performed, in which thinning is performed on the surface of the molded encapsulation layer 30 away from the carrier 10 to expose some of the first bumps 20 of the first chip 11 and the second chip 12 (e.g., the first bumps not covered by or bonded to an interconnect device). For example, in some embodiments, a chemical mechanical polishing process, an etching process, or other methods may be used to remove portions of the molding compound from over the first chip 11 and the second chip 12. After the thinning process, upper portions of the first bumps 20 (i.e., chip pins) of the first chip 11 and the second chip 12 and upper portions of the interconnection structures may be removed, exposing the conductive contact surfaces of the first bumps 20 of the first chip 11 and the second chip 12 and the interconnection structures.

Figure 2D:
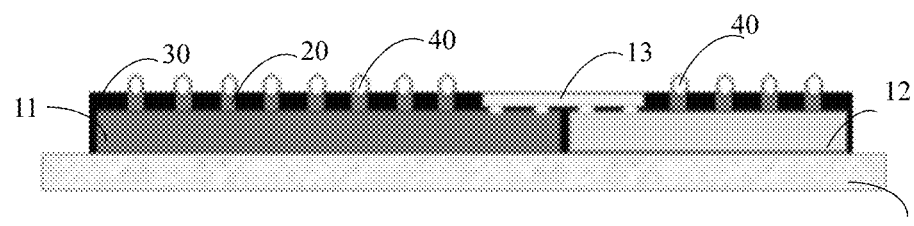

Referring to FIG. 2D, step 105 is performed, in which second bumps 40 are formed on the surface of the molded encapsulation layer 30 on the side where the first bumps 20 are exposed. For example, in some embodiments, the second bumps 40 may be formed directly on the metal contact surfaces of the first bumps 20 exposed on a side surface of the molded encapsulation layer 30, that is, solder bumps of a conductive material are formed on the metal contact surfaces of the first bumps 20 as the second bumps 40.

In other embodiments, a Redistribution Layers (RDL) layer 50 may be formed on a surface of the molded encapsulation layer 30 on a side where the metal contact surfaces of the first bumps 20 are exposed, and a plurality of second bumps 40 may be formed on the Redistribution layer 50. For example, the redistribution layer 50 may be formed by photolithography and electroplating on a side surface of the molded encapsulation layer 30 where the first bumps 20 are exposed, and the dielectric material of the molded encapsulation layer 30 may be a photosensitive material, a non-photosensitive material, a liquid material, a dry film material, or the like. In other embodiments, a solder covering layer (solder capping) may be further formed on a surface of the molded encapsulation layer 30 on the side where the first bumps 20 are exposed, and the solder covering layer accumulates a plurality of conductive bumps on the surface of the molded encapsulation layer 30 on the side where the first bumps 20 are exposed, so as to implement electrical connection between the chip package and an external semiconductor.

Figure 2E:
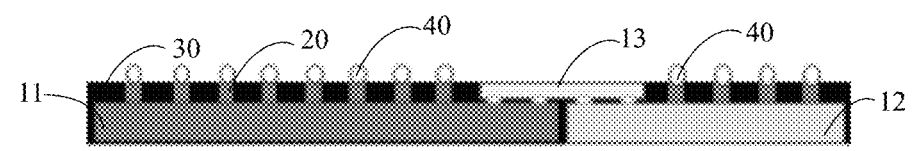

Referring to FIG. 2E, step 106 is performed, in which the carrier 10 is removed. For example, in some embodiments, a cutting process may be performed to remove the carrier 10, and the removal of the carrier 10 may utilize a laser process or an Ultraviolet (UV) irradiation process, but is not limited thereto. In other embodiments, the carrier 10 and the chip may be coupled using a peelable adhesive material and the removal in step 106 may involving tearing off the carrier 10 from the molded encapsulation layer, but is not limited thereto. After removing the carrier 10, the back surfaces of the first chip 11 and the second chip 12 are exposed.

FIG. 3A-3E illustrate cross-sectional views illustrating various stages in a process of forming a chip package according to some further embodiments. The above steps 101 to 106 are described in detail with reference to FIG. 3A to 3E.

Figure 3A:
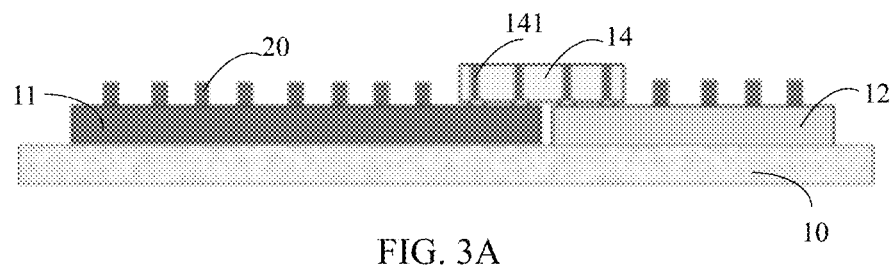
FIGS. 3A to 3E are schematic cross-sectional views illustrating at various stages in a process of forming a chip package according to another embodiment.

Referring to FIG. 3A, first, step 101 is performed, in which carrier 10, first chip 11 and second chip 12 are provided, and first chip 11 and second chip 12 are mounted on the surface of carrier 10 with their front surfaces facing upwards (i.e., away from the carrier). In some embodiments, the front surfaces of the first chip 11 and the second chip 12 are provided with first bumps 20. Next, step 102 is executed, in which the interconnection device 14 is attached to the front surfaces of the first chip 11 and the second chip 12 so that the first chip 11 is electrically connected to the second chip 12 through the interconnection device 14. The packaging method shown in FIG. 3A to 3E correspond to the embodiments described above with reference to FIGS. 2A-2E, with differences mainly in that the interconnection device 14 includes vertical interconnection vias 141, e.g., Through Silicon Vias (TSV) 141, so that I/O pins can be formed on the front surface (e.g., the surface facing away from the first and second chips) of the interconnection device 14 as well. In some embodiments, if the interconnection device 14 is formed as a passive device, the package may be formed as a 2.5D package, and if the interconnection device 14 is formed as an active device, the package may be formed as a 3D package.

Figure 3B:
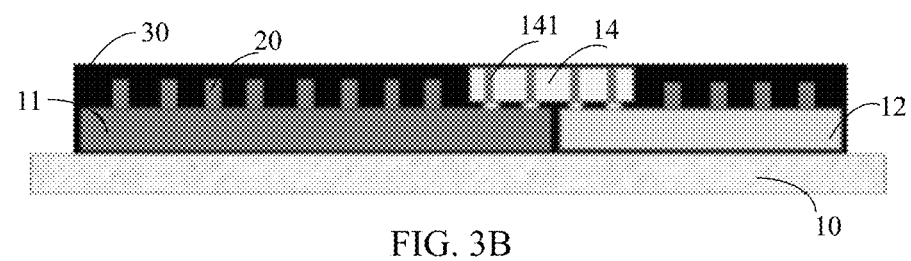

Referring to FIG. 3B, step 103 is performed, in which a molded encapsulation layer 30 is formed around the first chip 11 and the second chip 12. In some embodiments, the first chip 11 and the second chip 12 and the interconnection device 14 are embedded or partially embedded in the molded encapsulation layer 30.

Figure 3C:
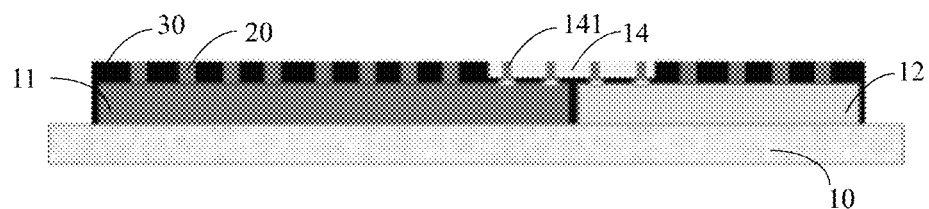

Referring to FIG. 3C, step 104 is performed, in which thinning is performed on the surface of the molded encapsulation layer 30 away from the carrier 10 to expose some of the first bumps 20 of the first chip 11 and the second chip 12 (e.g., the first bumps not covered by or bonded to an interconnect device).

Figure 3D:
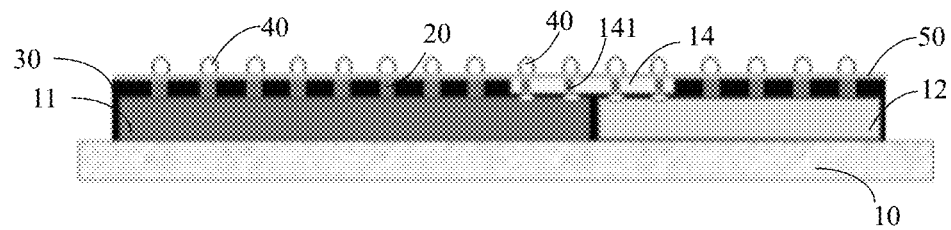

Referring to FIG. 3D, step 105 is performed, in which second bumps 40 are formed on the surface of the molded encapsulation layer 30 on the side where the first bumps 20 are exposed. A redistribution layer 50 may be formed on a surface of the molded encapsulation layer 30 on which the metal contact surfaces of the first bumps 20 are exposed, and a plurality of second bumps 40 may be formed on the redistribution layer 50. For example, the redistribution layer 50 may be formed by photolithography and electroplating on a side surface of the molded encapsulation layer 30 where the first bumps 20 are exposed, and the dielectric material of the molded encapsulation layer 30 may be a photosensitive material, a non-photosensitive material, a liquid material, a dry film material, or the like. In some alternative embodiments, the second bumps 40 may also be formed directly on the metal contact surfaces of the first bumps 20 exposed on one side surface of the molded encapsulation layer 30; a solder capping layer may also be formed on the surface of the molded encapsulation layer 30 on the side where the first bumps 20 are exposed, which has been explained in detail above and is thus not be repeated here.

Figure 3E:
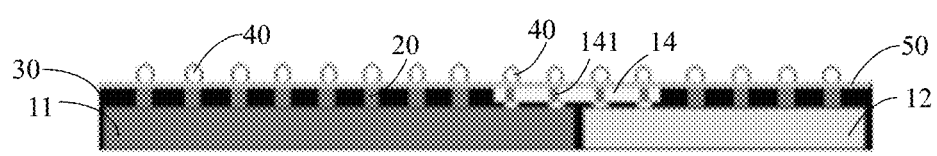

Referring to FIG. 3E, step 106 is performed, in which the carrier 10 is removed.

The steps of mounting the first chip 11 and the second chip 12 on the carrier 10, attaching the interconnection device 14 to the first chip 11 and the second chip 12, forming the molded encapsulation layer 30, thinning, and removing the carrier 10 shown in FIG. 3A to 3E are the same as or similar to those described in the above embodiments, and are not repeated here.

FIG. 4A-4E illustrate cross-sectional views illustrating various stages in forming a chip package, according to yet some further embodiments. The above steps 101 to 106 are described in detail with reference to FIG. 4A to 4E.

Figure 4A:
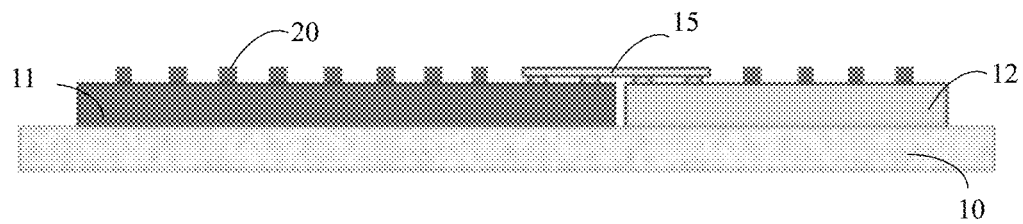
FIGS. 4A to 4E are schematic cross-sectional views illustrating at various stages in a process of forming a chip package according to yet another embodiment.

Referring to FIG. 4A, first, step 101 is performed, in which carrier 10, first chip 11 and second chip 12 are provided, and first chip 11 and second chip 12 are mounted on the surface of carrier 10 with their front surfaces facing upwards (i.e., away from the carrier). Wherein, the front surfaces of the first chip 11 and the second chip 12 are provided with first bumps 20, i.e. chip pins. As also shown in FIG. 4A, step 102 is executed, in which an interconnection device 15 is attached to the front surfaces of the first chip 11 and the second chip 12 so that the first chip 11 is electrically connected to the second chip 12 through the interconnection device 15.

Compared to the above embodiments, the packaging methods shown in FIG. 4A to 4E differ mainly in that the interconnection device 15 includes a flexible circuit, and the interconnection device 15 is thermocompression bonded to the front surfaces of the first chip 11 and the second chip 12 in step 102.

Figure 4B:
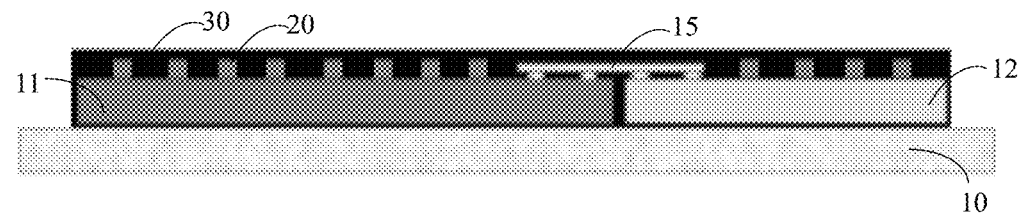

Referring to FIG. 4B, step 103 is performed, in which a molded encapsulation layer 30 is formed around the first chip 11 and the second chip 12. In some embodiments, the first chip 11 and the second chip 12 and the interconnection device 15 are embedded or partially embedded in the molded encapsulation layer 30.

Figure 4C:
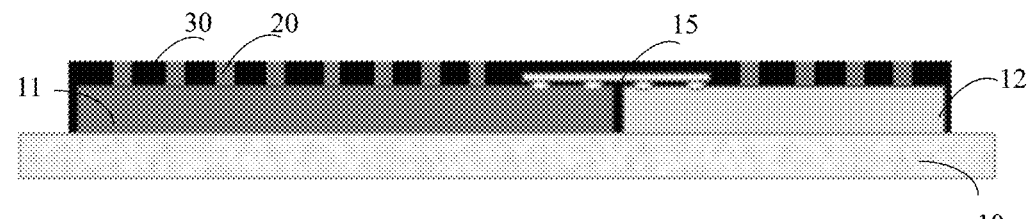

Referring to FIG. 4C, step 104 is performed, in which thinning is performed on the surface of the molded encapsulation layer 30 away from the carrier 10 to expose some of the first bumps 20 of the first chip 11 and the second chip 12 (e.g., the first bumps not covered by or bonded to an interconnect device).

Figure 4D:
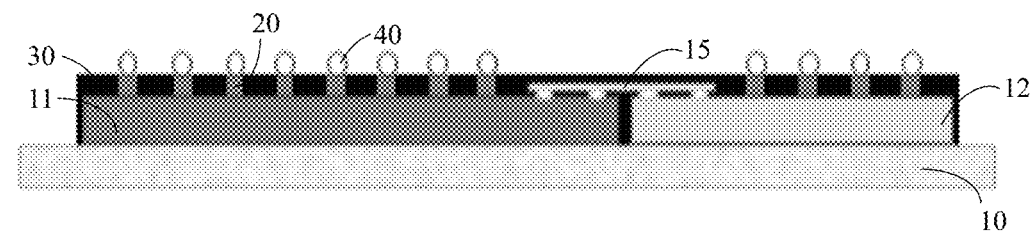

Referring to FIG. 4D, step 105 is performed, in which forming second bumps 40 are formed on the surface of the molded encapsulation layer 30 on the side where the first bumps 20 are exposed.

Figure 4E:
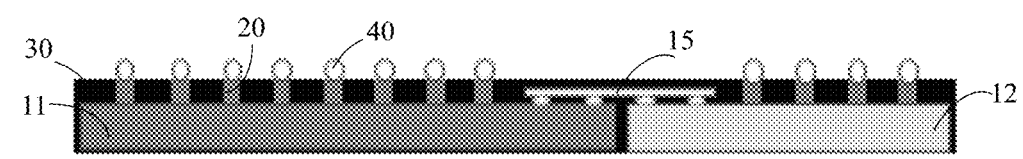

Referring to FIG. 4E, step 106 is performed, in which the carrier 10 is removed.

The steps shown in FIG. 4A to 4E of mounting the first chip 11 and the second chip 12 on the carrier 10, attaching the interconnection device 15 to the first chip 11 and the second chip 12, forming the molded encapsulation layer 30, thinning, removing the carrier 10, etc. correspond to similar steps described in the above embodiments, and are not repeated here.

According to various aspects of the above embodiments, the same or similar effects as the EMIB technology are achieved with lower cost and simpler manufacturing process by adopting new package structure designs and unique process flows. On the one hand, it does not require the embedding of interconnect devices in the substrate (substrate), reducing the complexity and cycle time of design and fabrication. On the other hand, the associated cost of the substrate is eliminated, thereby providing a flexible and low-cost solution for multi-chip attachment.

Figure 5A:
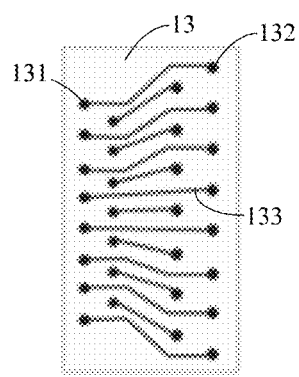
FIGS. 5A-5C are top views illustrating at various stages in a process of bonding an interconnect device and a chip in accordance with one embodiment.
Figure 5B:
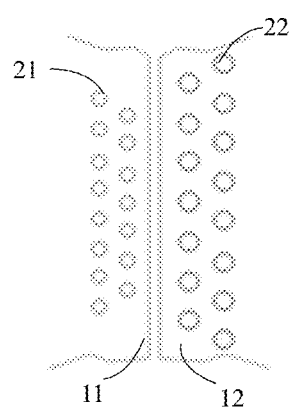
Figure 5C:
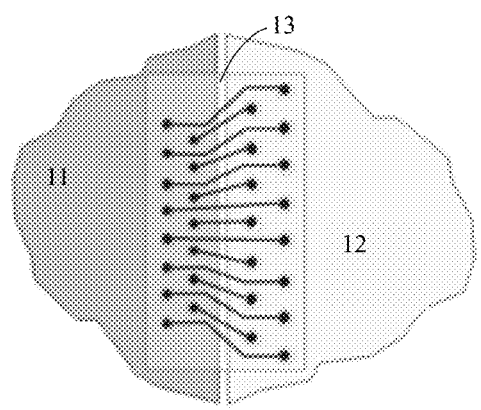

FIG. 5A-5C illustrate schematic diagrams illustrating bonding an interconnect device 13 to the front surfaces of first chip 11 and second chip 12, according to some embodiments.

Referring to FIG. 5A, in some embodiments, a first region of a first side of the interconnection device is formed with a plurality of first bond pads 131 for bonding to corresponding bumps 21 on the first chip 11, respectively, a second region of the first side of the interconnection device 13 is formed with a plurality of second bond pads 132 for bonding to corresponding bumps 22 on the second chip 12, respectively, and a fan-out circuit 133 is formed between the plurality of first bond pads 131 and the plurality of second bond pads 132 of the interconnection device 13. The interconnection device 13 may be predesigned and manufactured according to a chip package design. In some embodiments, a corresponding plurality of first bond pads 131 are formed on the interconnection device 13 according to positions of the corresponding bumps 21 in a predefined area near an edge of the first chip 11, a corresponding plurality of second bond pads 132 are formed on the interconnection device 13 according to a set pitch between the first chip 11 and the second chip 12 and positions of the corresponding bumps 22 in a predefined area near an edge of the second chip 12, and a fan-out circuit 133 is formed between the first bond pads 131 and the corresponding second bond pads 132.

It can be understood that during the packaging process of the semiconductor chip, mounting errors inevitably occur. For example, when the first chip 11 and the second chip 12 are mounted on the surface of one side of the carrier 10, a certain degree of mounting pitch error is generated, while the first bond pads 131 and the second bond pads 132 on the interconnection device 13 still have standard pitches determined by the chip design, causing difficulty in aligning and bonding the corresponding pads and bumps when the interconnection device 13 is later attached on the surfaces of the first chip 11 and the second chip 12.

Referring to FIG. 5A to 5C, according to some embodiments, the first bumps on the front surface of the first chip 11 includes a plurality of high-density bumps 21, and the first bumps on the front surface of the second chip 12 has a plurality of low-density bumps 22. In some embodiments, the contact surface of each of the high-density bumps 21 is smaller than any of the low-density bumps 22. So, after the first bond pads 131 of the interconnection device 13 can be aligned and bonded to the high-density bumps 21 of the first chip 11 at first, the second bond pads 132 of the interconnection device 13 can be self-aligned and bonded to the low-density bumps 22 of the second chip 12 using the high-density bumps 21 of the first chip 11 as a reference. Thereby, the high-density first bump 21 and the first bond pads 131 can achieve alignment bonding, while the low-density first bump 22 having a larger accommodating error space due to a larger contact area or diameter thereof can be self-aligned with the second bond pads 132, avoiding the problem of difficulty in alignment bonding due to errors.

According to some embodiments, the first chip 11 may be a logic chip such as a processor chip, and the second chip 12 may be a memory chip.

FIG. 6A-6E illustrate cross-sectional views illustrating various stages in a process of forming a chip package according to some further embodiments. The process of packaging two sets of chips is shown, and the steps 101 to 106 are described in detail below with reference to FIG. 6A to 6E.

Figure 6A:
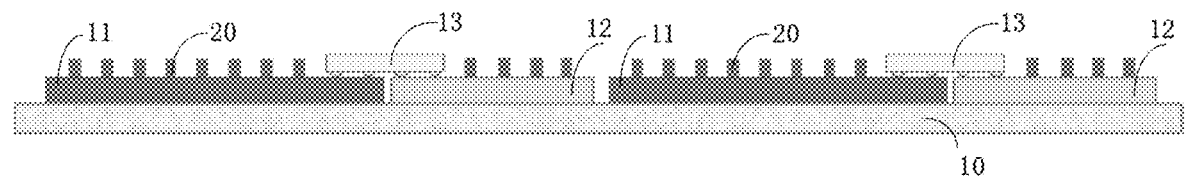
FIGS. 6A to 6E are schematic cross-sectional views illustrating at various stages in a process of forming a chip package according to still another embodiment.

Referring first to FIG. 6A, first, step 101 is performed, in which a carrier 10 and two chipsets are provided, each chipset including at least a first chip 11 and a second chip 12, and the first chip 11 and the second chip 12 are arranged on the surface of the carrier 10 with the front surfaces facing upwards (i.e., away from the carrier).

Next, step 102 is executed, in which an interconnection device 13 is attached to the front surfaces of the first chip 11 and the second chip 12 of each chipset so that the first chip 11 of each chipset is electrically connected to the second chip 12 through the interconnection device 13.

Figure 6B:
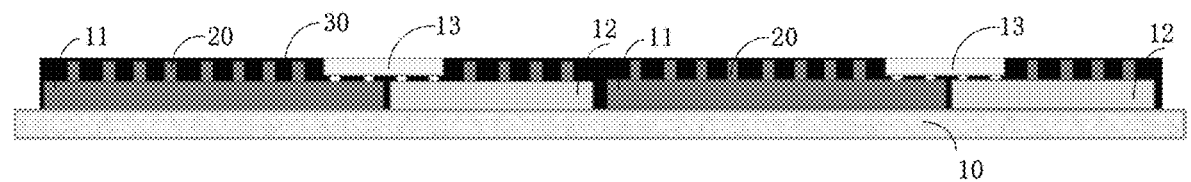

Referring to FIG. 6B, step 103 is performed, in which a molded encapsulation layer 30 is formed around the first chip 11 and the second chip 12 of each chipset. In some embodiments, the first chip 11 and the second chip 12 and the interconnection device 13 are embedded or partially embedded in the molded encapsulation layer 30.

Figure 6C:
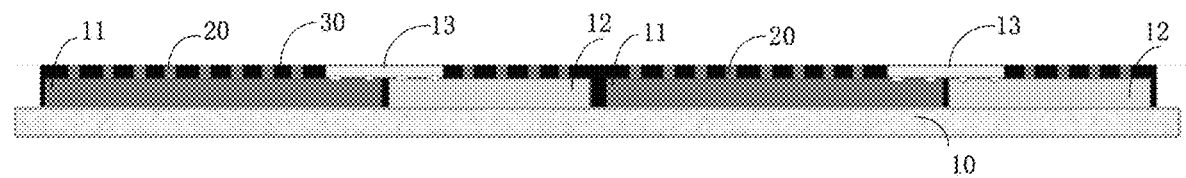

Referring to FIG. 6C, in step 104 thinning is performed on the surface of the molded encapsulation layer 30 away from the carrier 10 to expose some of the first bumps 20 of the first chip 11 and the second chip 12.

Figure 6D:
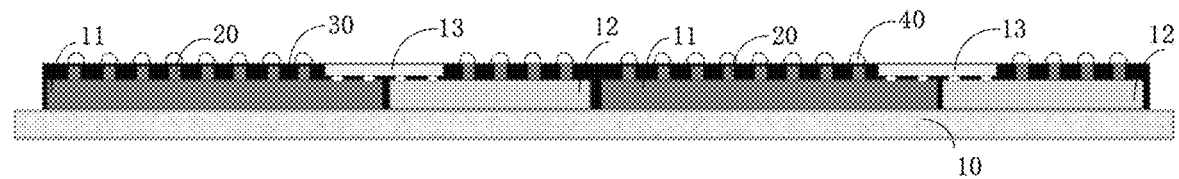

Referring to FIG. 6D, step 105 is performed, in which second bumps 40 are formed on the surface of the molded encapsulation layer 30 on the side where the first bumps 20 are exposed.

Figure 6E:
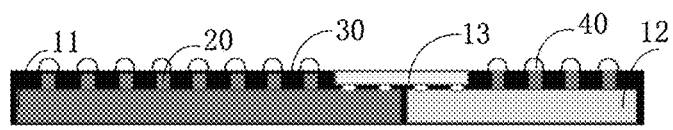

Referring to FIG. 6E, step 106 is performed, in which the carrier 10 is removed. Compared to the above embodiments, the packaging method shown in FIG. 6A to 6E is illustrated with multiple chipsets, and further, after the step 106, the following steps are performed, in which the molded encapsulation layer 30 is diced to obtain a plurality of unit packages. In some embodiments, each of the unit packages includes a chipset.

The steps of mounting the first chip 11 and the second chip 12 on the carrier 10, attaching the interconnection device 14 to the first chip 11 and the second chip 12, forming the molded encapsulation layer 30 30, thinning, and removing the carrier 10 shown in FIG. 6A to 6E correspond to similar steps described in the above embodiments, and are not repeated here.

Although two chipsets are shown in FIGS. 6A-6E, it should be understood that the number of chipsets may be any integer of 1 or more, so that a large-scale or wafer-level chip packaging can be realized.

The embodiments of the application also provide a chip package. Referring to FIG. 2E, a cross-sectional view of a chip package is shown. According to some embodiments, the chip package comprises a first chip 11 and a second chip 12; and an interconnection device 13 assembled on front surfaces of the first chip 11 and the second chip 12, whereby the first chip 11 is electrically connected to the second chip 12 through the interconnection device 13. In some embodiments, the front surfaces of the first chip 11 and the second chip 12 are provided with a plurality of first bumps. The chip package further comprises a molded encapsulation layer 30 around the first chip 11 and the second chip 12. In some embodiments, the first chip 11, the second chip 12 and the interconnection device 13 are embedded or partially embedded in the molded encapsulation layer 30, and the first bumps of the first chip 11 and the second chip 12 are exposed on a front surface of the molded encapsulation layer 30. In some embodiments, the chip package further comprises a plurality of second bumps formed on the front surface of the molded encapsulation layer 30.

FIG. 5A to 5C, in some embodiments, a first region of the first side of the interconnect device 13 is formed with a plurality of first bond pads 131 for respectively bonding to corresponding bumps 21 on the first chip 11, a second region of the first side of the interconnect device 13 is formed with a plurality of second bond pads 132 for respectively bonding to corresponding bumps 22 on the second chip 12, and a fan-out circuit is formed between the plurality of first bond pads 131 and the plurality of second bond pads 132 of the interconnect device 13.

In some embodiments, the interconnect devices are formed as passive devices or active devices.

In some embodiments, the interconnect device 13 includes vertical interconnect vias.

In some embodiments, the interconnect device 13 includes a flexible circuit thermocompressively bonded to the front surfaces of the first and second chips.

In some embodiments, the chip package further comprises a redistribution (or rewiring) layer 50 formed on the front surface of the molded encapsulation layer 30 where the first bumps are exposed, and the plurality of second bumps 40 are formed on the redistribution (or rewiring) layer 50.

In some embodiments, the plurality of second bumps 40 are formed as a solder covering (solder clamping) layer formed on the surface of a side of the molded encapsulation layer 30, where the first bumps 20 are exposed.

In some embodiments, the first bumps on the front surface of the first chip 11 include a plurality of high-density bumps 21, and the first bumps on the front surface of the second chip 12 include a plurality of low-density bumps 22. In some embodiments, a contact surface area or a diameter of each high-density first bump 21 is smaller than that of any of the low-density bumps 22 In some embodiments, in the chip package, the first bond pads 131 of the interconnection device 13 are aligned and bonded to the high-density bumps 21 of the first chip 11, so that the second bond pads 132 of the interconnection device 13 are self-aligned and bonded to the low-density bumps 22 of the second chip 12 by using the high-density bumps 21 as a reference.

Referring to FIG. 3E, in some further embodiments, interconnect device 14 may also be formed as an interconnect device having vertical interconnect vias 141 and may include additional contacts on a top surface thereof. Referring to FIG. 4E, in some other embodiments, the interconnection device 15 may also be formed as a flexible circuit 15 that is thermocompressively bonded to the front surfaces of the first chip 11 and the second chip 12.

In some embodiments, the interconnect devices (13, 14, 15) may be formed as passive devices or active devices.

In some embodiments, the first chip 11 is a processor chip and the second chip 12 is a memory chip.

While the spirit and principles of the invention have been described with reference to several particular embodiments, it is to be understood that the invention is not limited to the disclosed embodiments, nor is the division of aspects, which is for convenience only as the features in such aspects may not be combined to benefit. The invention is intended to cover various modifications and equivalent arrangements included within the spirit and scope of the appended claims.

What is claimed is:

1. A method of forming a chip package, comprising:
providing a carrier and at least one chipset, wherein each chipset comprises at least a first chip and a second chip, wherein front surfaces of the first chip and the second chip are provided with a plurality of first bumps;
mounting the first chip and the second chip in each chipset side by side on the surface of the carrier with the front surfaces of the first chip and the second chip facing away from the carrier and a first edge of the first chip facing a second edge of the second chip;
attaching a first side of an interconnect device to a first portion of the first bumps near the first edge of the first chip and to a second portion of the plurality of first bumps near the second edge of the second chip to enable the first chip in each chipset to be electrically connected to the second chip through the interconnect device;
forming a molded encapsulation layer, wherein the first chip, the second chip and the interconnection device are embedded or partially embedded in the molded encapsulation layer;
thinning one side of the molded encapsulation layer facing away from the carrier to remove at least portions of the molded encapsulation layer over the first chip, the second chip and the interconnect device, exposing a second side of at least a remaining portion of the interconnect device and metal contact surfaces of a third portion of the plurality of first bumps on the side of the molded encapsulation layer facing away from the carrier;
forming second bumps on the side of the molded encapsulation layer facing away from the carrier; and
removing the carrier;
wherein the interconnect device includes interconnection structures, and wherein thinning one side of the molded encapsulation layer facing away from the carrier comprises removing a portion of the interconnect device including portions of the interconnection structures.

2. The method of claim 1, wherein the at least one chipset includes multiple chipsets, the method further comprising:
after removing the carrier, dicing the molded encapsulation layer to obtain a plurality of unit packages, wherein each unit package includes a chipset.

3. The method of claim 1, wherein a first region on the first side of the interconnect device is formed with a plurality of first bond pads for respectively bonding to corresponding bumps on the first chip, a second region of the first side of the interconnect device is formed with a plurality of second bond pads for respectively bonding to corresponding bumps on the second chip, and a fan-out circuit is formed between the plurality of first bond pads and the plurality of second bond pads of the interconnect device.

4. The method of claim 3, wherein the interconnect device includes a passive device or an active device.

5. The method according to claim 1, wherein the interconnect device includes through silicon vias, the method further comprising forming I/O pins on a surface on the second side of the interconnect device.

6. The method of claim 1, further comprising:
forming a redistribution layer on the side of the molded encapsulation layer facing away from the carrier, and wherein the second bumps are formed on the redistribution layer.

7. The method of claim 1, wherein forming the second bumps on the side of the molded encapsulation layer facing away from the carrier comprises:
forming a solder covering layer on the side of the molded encapsulation layer facing away from the carrier.

8. The method of claim 3, wherein the first portion of the first bumps on the front surface of the first chip include a plurality of high-density bumps and the second portion of the plurality of first bumps on the front surface of the second chip include a plurality of low-density bumps, wherein each of the high-density bumps have a smaller contact area or diameter than any of the low-density bumps, the method further comprising:
aligning and bonding the plurality of first bond pads of the interconnection device respectively to the plurality of high-density bumps of the first chip, so that the plurality of second bond pads of the interconnection device are self-aligned and bonded respectively to the plurality of low-density bumps of the second chip.

9. The method of claim 1, wherein the plurality of first bumps are solder bumps.

10. A chip package, comprising:
a first chip and a second chip arranged side by side, a first edge of the first chip facing a second edge of the second chip, wherein front surfaces of the first chip and the second chip are provided with a plurality of first bumps;
an interconnection device attached to a first portion of the plurality of first bumps near the first edge of the first chip and a second portion of the plurality of first bumps near the second edge of the second chip, the first chip being electrically connected to the second chip through the interconnection device, the interconnection device having a first side and an opposing second side, the first side facing the first chip and the second chip;
a molded encapsulation layer, wherein the first chip, the second chip and the interconnection device are embedded or partially embedded in the molded encapsulation layer, and wherein metal contact surfaces of a third portion of the plurality of first bumps and the second side of the interconnection device are exposed on a front side of the molded encapsulation layer; and
a plurality of second bumps formed on the front side of the molded encapsulation layer;
wherein the first portion of the plurality of first bumps are on the front surface of the first chip and include a plurality of high-density bumps, and the second portion of the plurality of first bumps are on the front surface of the second chip and include a plurality of low-density bumps, wherein each of the high-density bumps have a smaller contact area or diameter than any of the low-density bumps, and wherein the high-density bumps are arranged with a higher density than the low-density bumps; and
wherein a first region of the first side of the interconnection device is formed with a plurality of first bond pads for respectively bonding to corresponding bumps on the first chip, a second region of the first side of the interconnection device is formed with a plurality of second bond pads for respectively bonding to corresponding bumps on the second chip, and a fan-out circuit is formed between the plurality of first bond pads and the plurality of second bond pads of the interconnection device.

11. The chip package of claim 10, wherein the interconnection device includes a passive device or an active device.

12. The chip package of claim 10, wherein the interconnection device includes through silicon vias and 1/0 pins are formed on a surface on the second side of the interconnection device.

13. The chip package of claim 10, further comprising:
a redistribution layer formed on the front side of the molded encapsulation layer where the third portion of the plurality of first bumps are exposed, and the plurality of second bumps are formed on the redistribution layer.

14. The chip package of claim 10, wherein the plurality of second bumps are formed from a solder covering layer formed on the front surface side of the molded encapsulation layer where the third portion of the plurality of first bumps and the second side of the interconnection device are exposed.

15. The chip package of claim 10, wherein the plurality of first bumps are solder bumps.

16. The chip package of claim 15, wherein at least some of the second bumps are formed directly on exposed metal contact surfaces of corresponding first bumps of the third portion of the plurality of first bumps.

17. A method of forming a chip package, comprising:
providing a carrier and at least one chipset, wherein each chipset comprises at least a first chip and a second chip, wherein front surfaces of the first chip and the second chip are provided with a plurality of first bumps;
mounting the first chip and the second chip in each chipset side by side on the surface of the carrier with the front surfaces of the first chip and the second chip facing away from the carrier and a first edge of the first chip facing a second edge of the second chip;
attaching a first side of an interconnect device to a first portion of the plurality of first bumps near the first edge of the first chip and to a second portion of the plurality of first bumps near the second edge of the second chip to enable the first chip in each chipset to be electrically connected to the second chip through the interconnect device, wherein the interconnect device is attached to the front surfaces of the first and second chips before the first chip and the second chip are embedded or partially embedded;
forming a molded encapsulation layer, wherein the first chip, the second chip and the interconnect device are embedded or partially embedded in the molded encapsulation layer;
thinning one side of the molded encapsulation layer facing away from the carrier to remove at least portions of the molded encapsulation layer over the first chip, the second chip and the interconnect device, exposing a second side of at least a remaining portion of the interconnect device and metal contact surfaces of a third portion of the plurality of first bumps on the side of the molded encapsulation layer facing away from the carrier;
forming second bumps on the side of the molded encapsulation layer facing away from the carrier; and
removing the carrier.

* * * * *